United States Patent
Suzumura et al.

(10) Patent No.: US 6,373,101 B1
(45) Date of Patent: Apr. 16, 2002

(54) SOLID-STATE RELAY

(75) Inventors: Masahiko Suzumura, Otsu; Hitomichi Takano, Neyagawa; Yuji Suzuki, Osaka; Takashi Kishida, Hirakata; Yoshiki Hayasaki, Osaka; Yoshifumi Shirai, Hirakata; Takeshi Yoshida, Shijonawate; Yasunori Miyamoto, Matsusaka, all of (JP)

(73) Assignee: Matsushita Electric Works, Osaka (JP)

( * ) Notice: Subject to any disclaimer, the term of this patent is extended or adjusted under 35 U.S.C. 154(b) by 0 days.

(21) Appl. No.: 09/709,528

(22) Filed: Nov. 13, 2000

Related U.S. Application Data

(62) Division of application No. 09/105,464, filed on Jun. 26, 1998, now Pat. No. 6,211,551.

(30) Foreign Application Priority Data

| Jun. 30, 1997 | (JP) | P09-174306 |
| Nov. 14, 1997 | (JP) | P09-314029 |
| Nov. 14, 1997 | (JP) | P09-314036 |
| Dec. 22, 1997 | (JP) | P09-352576 |

(51) Int. Cl.⁷ ............ H01L 29/76; H01L 27/01
(52) U.S. Cl. .......... 257/343; 257/341; 257/347
(58) Field of Search ................ 257/343, 335, 257/340, 341, 347

(56) References Cited

U.S. PATENT DOCUMENTS

| 4,864,126 A | 9/1989 | Walters et al. ............ 250/551 |
| 5,286,995 A | 2/1994 | Malhi ........................ 257/549 |
| 5,378,912 A | 1/1995 | Pein ........................... 257/335 |

(List continued on next page.)

FOREIGN PATENT DOCUMENTS

| DE | 40 42 334 A1 | 9/1991 |
| DE | 41 29 835 A1 | 3/1993 |
| GB | 2 243 485 A | 10/1991 |
| JP | 63-278375 | 11/1988 |
| JP | 07211911 | 8/1995 |
| JP | 9-312392 | 12/1997 |

OTHER PUBLICATIONS

Ying–Keung Leung et al., "Self–Heating Effect in Lateral DMOS on SOI" Proceedings of the 1995 International Symposium on Power Semiconductor Devices and ICS, May 23, 1995, pp 136–140 (XP–002141828).

A.K. Paul et al., "High Voltage LDMOS Transistors in Sub–Micron SOI Films" IEEE, 1996, pp 89–92 (XP–000598404).

*Primary Examiner*—Tom Thomas
*Assistant Examiner*—Shouxiang Hu
(74) *Attorney, Agent, or Firm*—Rader, Fishman & Grauer, PLLC

(57) ABSTRACT

A solid state relay composed of a series connected pair of LDMOSFETs has a minimized output capacitance. Each LDMOSFET is configured to have a silicon layer of a first conductive type, a drain region of the first conductive type diffused in the top surface of the silicon layer, a well region of a second conductive type diffused in the silicon layer in a laterally spaced relation from the drain region, and a source region of the first conductive type diffused within the well region to define a channel extending between the source region and a confronting edge of the well region along the top surface of the silicon layer. Each LDMOSFET is of an SOI (Silicon-On-Insulator) structure composed of a silicon substrate placed on a supporting plate, a buried oxide layer on the silicon substrate, and the silicon layer on the buried oxide layer. The well region is diffused over the full depth of the silicon layer to have its bottom in contact with the buried oxide layer, so that the well region forms with the silicon layer a P-N interface only at a small area adjacent the channel. Because of this reduced P-N interface and also because of the buried oxide layer exhibiting a much lower inductive capacitance than the silicon layer, it is possible to greatly reduce a drain-source capacitance for minimizing the output capacitance of the relay in the non-conductive condition.

6 Claims, 9 Drawing Sheets

U.S. PATENT DOCUMENTS

| | | | |
|---|---|---|---|
| 5,382,818 A | 1/1995 | Pein | 257/347 |
| 5,554,872 A | 9/1996 | Baba et al. | 257/342 |
| 5,780,900 A | 7/1998 | Suzuki et al. | 257/335 |
| 5,828,112 A | 10/1998 | Yamaguchi | 257/378 |
| 5,874,768 A | 2/1999 | Yamaguchi et al. | 257/493 |
| 5,981,983 A | 11/1999 | Funaki et al. | 257/138 |

SOLID-STATE RELAY

This is a Division of application Ser. No. 09/105,464 filed Jun. 26, 1998, now U.S. Pat. No. 6,211,551. The disclosure of the prior application(s) is hereby incorporated by reference herein in its entirety.

BACKGROUND ART

1. Field of the Invention

The present invention is directed to a solid-state relay, and more particularly to a solid-state relay having a pair of LDMOSFETs of which drains define output terminals for connection with a load to be controlled by the relay.

2. Description of the Prior Art

Solid-state relays have been widely utilized in place of mechanical relays in view of many advantages including miniaturized configuration, low-energy consumption, and high-speed switching performance. Because of the above advantages, the solid-state relay can be successfully incorporated in a small device, such as an automatic test equipment for testing LSI chips, for example. When utilized for the measurement of this kind, the relay is designed to provide a series of output signal as a testing signal. As the frequency of the output signal becomes higher, the relay is required to have a lower output capacitance developed across output terminals of the relay during off-periods of the output signal, i.e., the periods in which the output terminals are in nonconductive condition, in addition to minimizing on-state resistance between the output terminals during on-periods of the output signal. The output capacitance is the sum of a drain-source capacitance and a gate-drain capacitance at the non-conductive condition of the output terminals of the relay.

Japanese Patent Laid-Open Publication No. 9-312392 discloses a solid state relay which utilizes LDMOSFETs as switching elements in an attempt to reduce the output capacitance. The LDMOSFET has structure in which a well region and a drift region are diffused in the top surface of a silicon layer with a source region being diffused within a confine of the well region and with a drain region being diffused within a confine of the drift region. However, since the drift region and the well region are formed in the top surface of the silicon layer, there is formed a P-N interface of extended area including the bottoms of the drift region and the well region. The P-N interface of such enlarged area is responsible for increasing a capacitance between the source and drain of LDMOSFET. Accordingly, the LDMOSFET of this structure is not satisfactory for minimizing the output capacitance between the output terminals of the relay.

SUMMARY OF THE INVENTION

The present invention has been accomplished in view of the above insufficiency to provide a solid state relay which is capable of minimizing an output capacitance across output terminals of the relay, while retaining a low on-state resistance across the output terminals. The solid-state relay in accordance with the present invention comprises a control unit which gives an electrical energy upon receipt of an input signal and a pair of LDMOSFETs (Lateral Double-diffused Metal Oxide Semiconductor Field Effect Transistors) mounted on a supporting plate of electrically conductive material. LDMOSFETs are arranged in circuit with individual gates commonly coupled to receive the electrical energy from the control unit so as to be driven thereby to turn on and off. Sources of LDMOSFETs are connected to each other in a series fashion so as to have individual drains connected to the output terminals, respectively. Each LDMOSFET is configured to have a silicon layer of a first conductive type, a drain region of the first conductive type diffused in the top surface of the silicon layer, a well region of a second conductive type diffused in the silicon layer in a laterally spaced relation from the drain region, and a source region of the first conductive type diffused within the well region to define a channel extending between the source region and a confronting edge of the well region along the top surface of the silicon layer. The source region and the drain region define respectively the source and drain of LDMOSFET. Drain and source electrodes are placed respectively over the drain and source regions in electrically connected relation thereto. A gate electrode is connected to a gate layer of an electrically conductive material which is placed over the channel through a dielectric layer and which defines the gate of LDMOSFET. A characterizing feature of the solid-solid state relay resides in that each LDMOSFET is of an SOI (Silicon-On-Insulator) structure composed of a silicon substrate placed on said supporting plate, a buried oxide layer on the silicon substrate, and the silicon layer on the buried oxide layer, and that the well region extends the full depth of the silicon layer to have a bottom abutted against said buried oxide layer.

Since the well region is diffused over the full depth of the silicon layer to have its bottom abutted against the buried oxide layer, the well region of the second conductive type forms with the silicon layer of the first conductive type a P-N interface only at a small portion adjacent the channel. That is, only a side boundary of the well region laterally confronting the drain region forms the P-N interface. Because of this reduced P-N interface and also because of the buried oxide layer exhibiting much lower capacitance than the silicon layer, it is possible to greatly reduce a drain-source capacitance for minimizing the output capacitance of the relay in the non-conductive condition. Also the reduced P-N interface area can reduce a leak current at the non-conducting condition of the output terminals. Moreover, the SOI structure can assure sufficient flexibility for mounting the LDMOSFET on the supporting plate, either with one of the drain and source being electrically connected to the supporting plate or being electrically isolated, in accordance with particular demands.

One of the source region and the drain region is configured to surround the other within a plane of the silicon layer. This surrounding arrangement enables the source region to confront the drain region over a prolonged line in the plane of the silicon layer, thereby reducing an on-state resistance between the output terminals of the relay. Accordingly, the relay can enjoy an optimum combination of the low output capacitance and the low on-state resistance. Although there exists a factual relation that the smaller the on-state resistance is, the greater the output capacitance becomes, the above structure of reducing the P-N interface area is most effective to minimize the output capacitance when the on-state resistance is required to be reduced to an acceptable extent. Preferably, the source region is configured to surround the drain region.

Further, the present invention envisages to minimize an effect of developing an additional capacitance between the source and the drain or between the gate and the source owing to the presence of the buried oxide layer, particularly when the single supporting plate mounting the pair of LDMOSFETs is utilized to electrically interconnect the sources of LDMOSFETs or when the two separate supporting plates each mounting the LDMOSFET are each utilized to interconnect the drain and the output terminal of the relay.

In order to facilitate the recognition of several advantages of the present invention, there are introduced terms, "primary drain-source capacitance" and "secondary drain-source capacitance". The primary drain-source capacitance is utilized to denote the capacitance substantially developed through a portion of the silicon layer between drain region and source region, while the secondary drain-source capacitance is for an additional capacitance developed through the buried oxide layer in a vertical path from the source region to the supporting plate kept at the same potential of the drain or from the drain region to the supporting plate at the same potential of the source.

The silicon layer has a peripheral zone located laterally outwardly of the well region and electrically isolated from the drain region by the well region. It is preferred to electrically connect the peripheral zone and the drain commonly to the supporting plate. Thus, the peripheral zone around the well region can be kept at the same potential as the drain region, thereby eliminating an additional path of developing a capacitance through the buried oxide layer between the peripheral zone and the silicon substrate. Otherwise, the additional path would add a capacitance in parallel with the secondary drain-source capacitance inevitably developed between the bottom of the well region and the supporting plate through the buried oxide layer, thereby bringing about unduly large parallel connected capacitance between the source and drain.

In addition, a separator ring of dielectric material may be formed in the peripheral zone to surround closely the well region in such a manner as to electrically isolate the well region from the peripheral zone. Thus, it is possible to prevent an unduly high capacitance from developing between the well region and the peripheral zone, thereby minimizing the overall drain-source capacitance when the drain and the peripheral zone are electrically connected to the supporting plate.

Further, at least one separated land of the second conductive type may be diffused in the silicon layer outwardly of the well region in a spaced relation therefrom. At least one of the source electrode and the gate electrode extends over the separated land in a spaced relation thereto from the corresponding one of the source and the channel to form a wiring pad for wiring connection to a complementary circuit element. Also with this arrangement of providing the wiring pad over the separated land, it is possible to reduce an additional capacitance resulting from the provision of the pad and correspondingly minimize the overall source-drain or gate-drain capacitance.

Alternatively, at least one separated land of the first conductive type may be diffused within the well region to extend the full depth of the silicon layer in an electrically isolated relation from the source region. At least one of the source electrode and the gate electrode extends over the separator region in a spaced relation thereto from the corresponding one of the source and the channel to form a wiring pad for wiring connection to a complementary circuit element for the purpose of minimizing the in order to minimize the overall source-drain or gate-drain capacitance in the manner as discussed in the above.

When the drain region is configured to surround the well region and the supporting plate is utilized to electrically interconnect the sources of the two LDMOSFETs, it is preferred to connect a peripheral zone outwardly of the drain region electrically to the supporting plate. Thus, the peripheral zone outwardly of the drain region can develop no additional capacitance through the corresponding portion of the buried oxide layer, thereby minimizing the source-drain capacitance. Also in this structure, a dielectric separator ring may be utilized to surround closely the drain region. The separator ring is formed in the silicon layer to isolate the drain region from the peripheral zone of the silicon layer, in order to give an optimum dielectric strength between the drain and the source, in addition to minimizing the source-drain capacitance.

When the source or drain is electrically connected to the supporting plate, the silicon substrate is preferably formed with a cavity or recess extending in correspondence to the drain region or well region in order to further reduce the drain-source capacitance by the intervention of the cavity or recess between the source or drain region and the supporting plate.

In a further version, there is formed an electrically insulator stud which extends from the buried oxide layer through a center of the drain region to project on the top surface of the silicon layer in such a manner as to expose the drain region in an annular shape around the stud. The associated drain electrode is arranged to extend over the insulator stud with a peripheral zone of the drain electrode being electrically connected to the drain region of the annular shape. The combination of the insulator stud and drain electrode can effectively reduce the drain-source capacitance while assuring sufficient dimensions for the drain electrode.

The silicon substrate may comprise a pair of semiconductor stratums of opposite conductive types which develops a depletion layer at the P-N interface therebetween. The resulting depletion layer gives an additional capacitance which is added in series captive connection with the secondary drain-source capacitance of the buried oxide layer, thereby reducing the overall drain-source capacitance.

The relay of the present invention may further include a dielectric layer on a bottom of the silicon substrate opposite of said buried oxide layer in order to further reduce the secondary drain-source capacitance.

In a further version of the present invention, it is contemplated to integrate the two LDMOSFET in a single device structure. In this structure, the well region are formed in the single silicon layer over the full depth thereof in such a manner as to form therein a laterally isolated pair of first and second active zones. Diffused in the well region is a pair of first and second source regions which surround respectively the first and second active zones and define first and second channels extending within the well regions from the first and second source regions to confronting boundaries of the first and second active zones, respectively. First and second drain regions are diffused respectively within the first and second active zone so as to be isolated from each other by the well region. First and second drain electrodes are placed respectively on the first and second drain regions in an electrical connecting relationship therewith. At least one gate electrode is electrically connected to first and second gate layers which are placed over the first and second channels respectively through dielectric layers and define first and second gates of the two LDMOSFETs, respectively. A common source electrode is provided to bridge over the first and second source regions and is electrically connected thereto. The silicon substrate carrying the silicon layer through the buried oxide layer is mounted on the supporting frame with the output terminals being electrically connected respectively to the first and second drains. Thus, the two LDMOSFETs can be realized in the single device structure and can be easily assembled into the solid-state relay, while retaining to minimize drain-source capacitance.

In this structure of realizing the two LDMOSFETs commonly in the single silicon layer, the supporting plate may be electrically isolated from the common source as well as from the first and second drains, and the output terminals are formed separately from the supporting plate for electrically connection with the first and second drains.

These and still other objects and advantageous features of the present invention will become more apparent from the following description of the embodiments when taking in conjunction with the attached drawings.

DESCRIPTION OF THE EMBODIMENT

Figure 1:
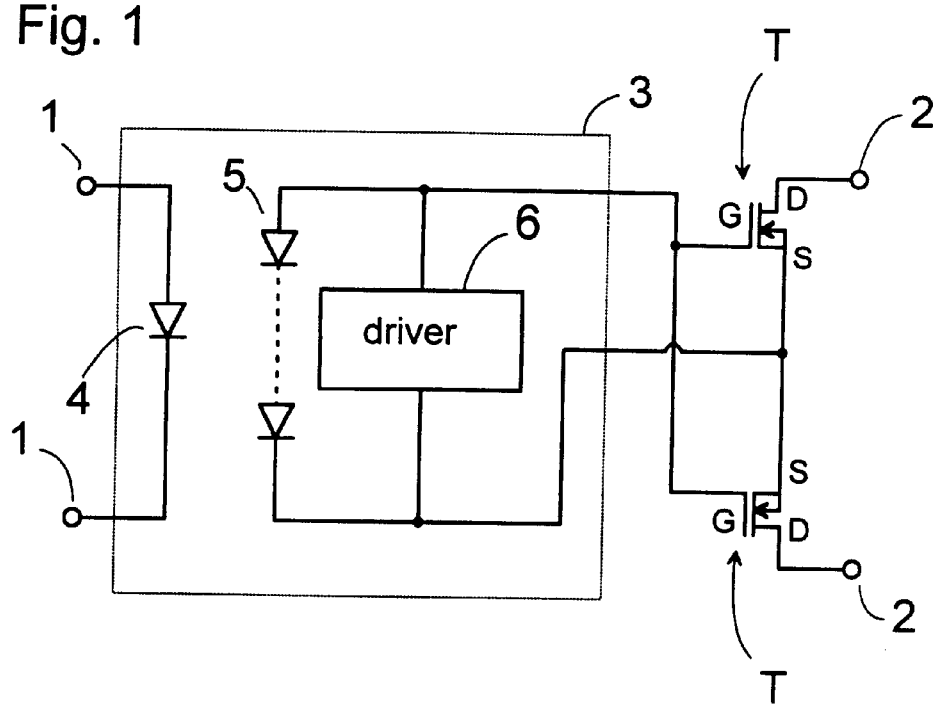
FIG. 1 is a circuit diagram of a solid-state relay of the present invention.
Figure 2:
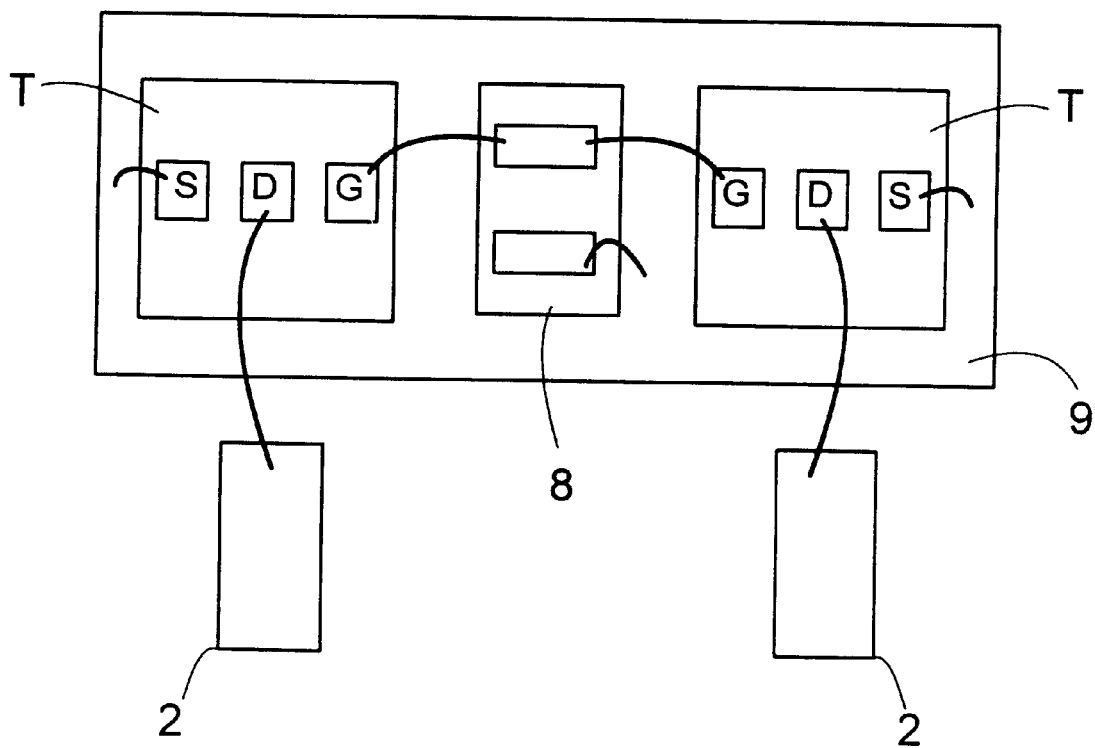
FIG. 2 is a schematic view illustrating a typical arrangement of electrical connections of the above relay in accordance with a first embodiment of the present invention.

As shown in FIG. 1, a solid-state relay of the present invention comprises a pair of LDMOSFETs (Lateral Double-diffused Metal Oxide Semiconductor Field Effect Transistors) T connected in series between output terminals 2 which are adapted to be connected across a load to be operated by the relay. LDMOSFETs (hereinafter sometimes referred to simply as FETs) are driven to turn on and off by a control unit 3 which gives an electrical energy upon receipt of an input signal. The control unit 3 is composed of a light emitting diode 4 connected to give off a light upon conduction between input terminals 1, a photovoltaic cells 5 which generate a photovoltaic voltage upon receiving an optical signal from the light emitting diode 4, and a driver 6 connected in circuit to develop an operating voltage from the photovoltaic voltage and apply the operating voltage to gates of the individual FETs. The control unit 3 is provided in the form of a single chip 8 which is mounted together with chips of FETs on a supporting plate 9 of an electrically conductive material, as shown in FIG. 2.

Sources S of the two FETs T are connected to each other through the supporting plate 9, while gates G of the two FETs are commonly connected to a corresponding electrode of the control unit 3. Drains D of the two FETs are connected respectively to output terminals 2 formed separately from the supporting plate 9. Alternatively, the two FETs and the chip 8 of the control unit 3 may be mounted respectively on separate supporting plates. The two FETs and the chip of the control unit 3 are encapsulated in a molded relay housing together with the associated supporting plate or plates.

Figure 3:
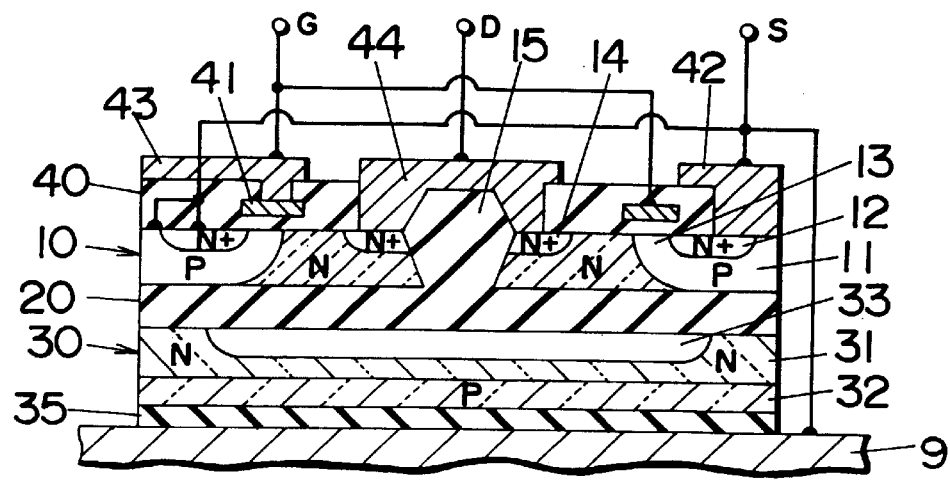
FIG. 3 is a partial vertical section of an SOI-LDMOSFET utilized in the relay of the first embodiment.
Figure 4:
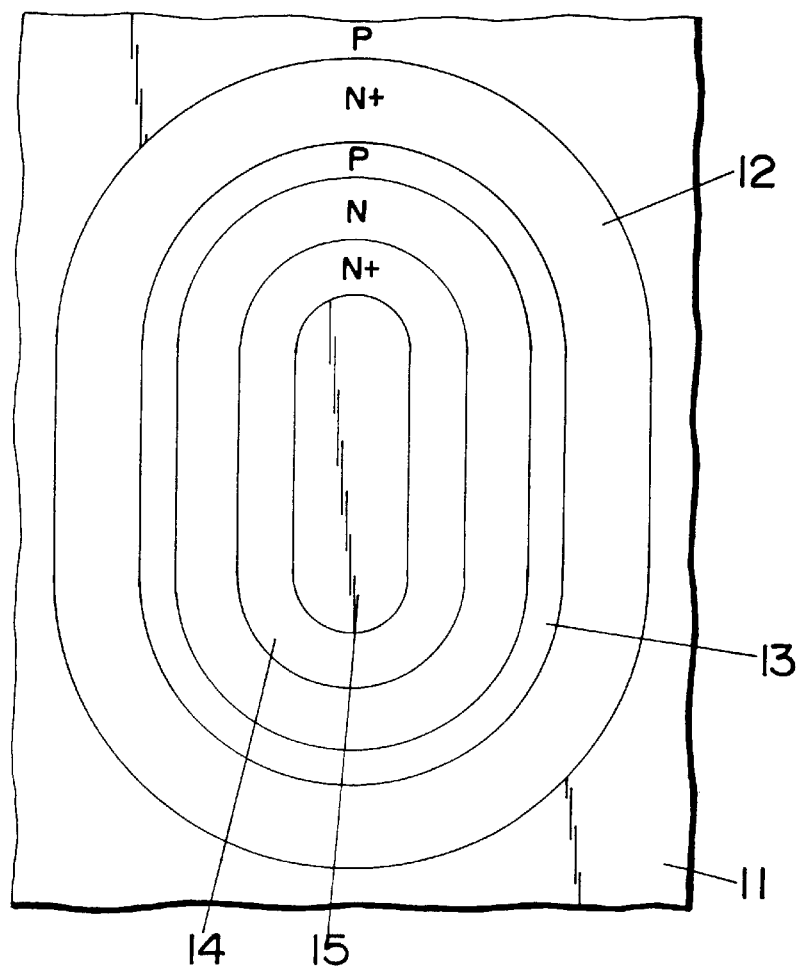
FIG. 4 illustrates a planar arrangement of well, source, drain regions of the SOI-MOSFET of FIG. 3.

Referring now to FIGS. 3 and 4, there is shown a cross-section of LDMOSFET provided in an SOI (Silicon-On-Insulator) structure which comprises a silicon layer 10, a buried oxide layer of $SiO_2$ 20 and a silicon substrate 30. The silicon layer 10 is of a first conductive type, typically N-type in which a well region 11 of the second conductive type, i.e., P-type is diffused to extend around the periphery of the silicon layer 10. The well region 11 extends the full depth of the silicon layer to have its bottom surface reaching the buried oxide layer 20. Diffused in the top surface of the well region 11 is a source region 12 of N-type which extends in the form of a closed loop to define the source of FET and to define a loop-shaped channel 13 between the source region 12 and a confronting inner periphery of the well region 11. A drain region 14 of N-type is diffused centrally in the top surface of the silicon layer 10 within a confine of the well region 11 in a laterally spaced relation therefrom to define the drain of FET. Extending centrally through the silicon layer 10 and through the drain region 14 is an insulator stud 15 which is formed by LOCOS (Local Oxidation of Silicon) technique to have its top projecting above the top surface of the silicon layer 10 and have its bottom integrating into the buried oxide layer 20.

Figure 5:
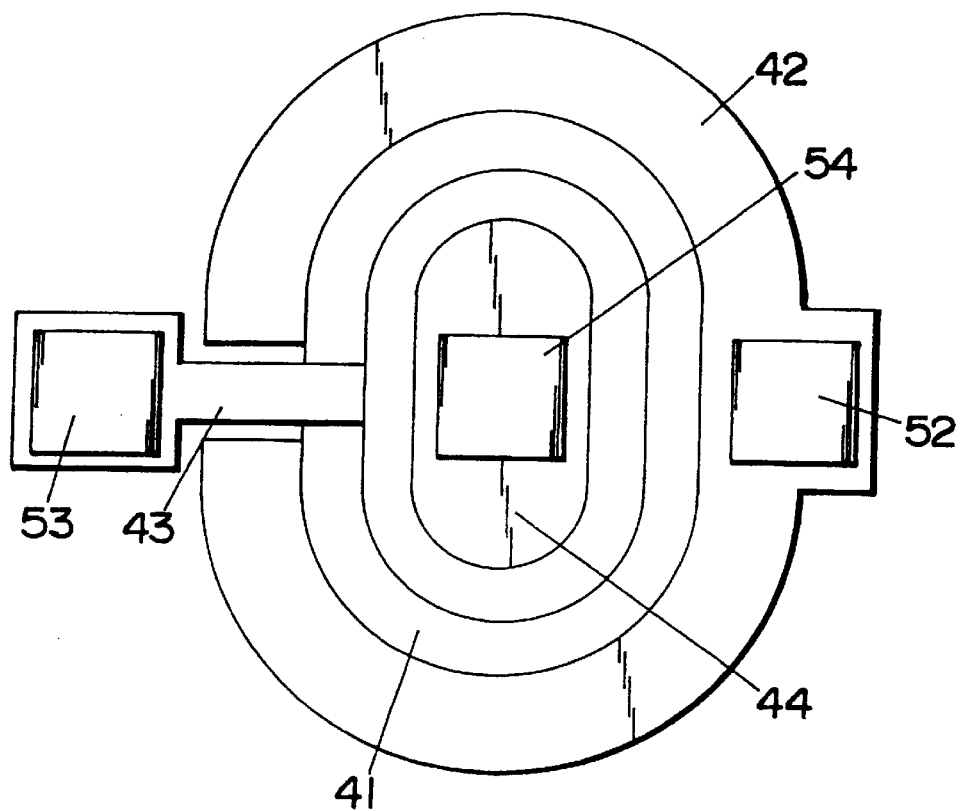
FIG. 5 illustrates a planar arrangement of gate, drain, and source electrodes and individual pads thereof for the above SOI-MOSFET.

The top surface of the silicon layer 10 is covered with a field oxide layer of $SiO_2$ 40 having a gate layer 41 of doped polysilicon, an aluminum-made gate electrode 43, an aluminum-made source electrode 42, and an aluminum-made drain electrode 44. The gate layer 41 extends over the channel 13 in a spaced relation therefrom to define the gate of FET and is connected to the gate electrode 43. The source electrode 42 penetrates through the field oxide layer 40 to reach a portion bridging over the source region 12 and the well region 11 on top of the silicon layer 10, while the drain electrode 44 penetrates through the silicon layer 10 over the insulator stud 15 to contact with an annulus of the drain region around the insulator stud 15. As shown in FIG. 5, the source electrode 42 is of a closed loop configuration in a horizontal plane and is provided with a square pad 52 for wiring connection to the supporting plate 9. The drain electrode 44 is formed thereon with a like square pad 54 for wiring connection to the corresponding output terminal 2. The gate electrode 43 is extends laterally outwardly from the loop-shaped gate layer 41 to have an extension on which a like pad 53 is formed for wiring connection to the corresponding element of the control unit 3.

Turning back to FIG. 3, the silicon substrate 30 is composed of a N-type upper stratum 31 and a P-type lower stratum 32 placed on the supporting plate 9 through a dielectric layer 35 which may be an oxide, nitride, or non-doped silicon layer integral with the silicon substrate 30 or a separately formed dielectric layer. The upper stratum 31 includes a cavity 33 which is formed at an interface with the buried oxide layer 20 to extend in an opposed relation to a portion of the silicon layer 10 ranging from the drain region 14 to the inner periphery of the well region 11.

In the above structure, a primary drain-source capacitance is developed in a lateral path between the drain source region 14 and the well region 11. However, because of the bottom of the well region 11 contacts directly with the buried oxide layer rather than through a portion of the silicon layer 10 having intrinsically large specific capacitance than the oxide layer 20, the primary drain-source capacitance developed in the primary vertical path is much reduced.

As a result of the supporting plate 9 is utilized to be electrically connected to the source, there develops a secondary drain-source capacitance in a vertical path from the drain region 14 or drain electrode 44 to the supporting plate 9 through corresponding portions of the buried oxide layer 20, the silicon substrate 30, and the dielectric layer 35. Although the secondary capacitance is smaller than the primary capacitance owing to the intervention of the buried oxide layer 20 of small specific capacitance, the secondary capacitance is connected in parallel with the primary capacitance to increase the parallel sum of the capacitance. Therefore, it is required to reduce the secondary capacitance as much as possible. The secondary capacitance can be reduced by the provisions of the insulator stud 15, the dielectric layer 35, the P-N junction in the silicon substrate 30, and the cavity 33 in the silicon substrate 30. Firstly, the insulator stud 15 can reduce an effective area of the drain region 14 responsible for developing the secondary capacitance with the supporting plate 9, while assuring sufficient dimensions for providing the pad 54 on the drain electrode 44, thereby reducing the secondary capacitance developed in the vertical path. Secondly, the intervention of the dielectric layer 35 will add a capacitance which is added in series capative connection with the capacitance of the buried oxide layer to thereby lower the secondary capacitance. Thirdly, the P-N junction formed in the silicon substrate 30, i.e. between the upper and lower stratums 31 and 32 will develop a depletion layer which develops a capacitance to be connected in a series relation with the capacitance of the buried oxide layer 20, lowering the secondary capacitance. Further, the cavity 33 at the interface between the buried oxide layer 20 and the silicon substrate 30 can adds a capacitance in series capative connection with the capacitance of the buried oxide layer 20 to lower the secondary capacitance. Accordingly, the overall drain-source capacitance can be much reduced to thereby minimize the output capacitance between the output terminals 2 of the relay. It should be noted in this connection that although the provisions of the insulator stud 15, the dielectric layer 35, the PN-junction in the silicon substrate 30, and the cavity 33 in the silicon substrate 30 are preferred to reduce the secondary drain-source capacitance and therefore the overall drain-source capacitance, the overall drain-source capacitance can be reduced sufficiently without any of these features.

Figure 6:
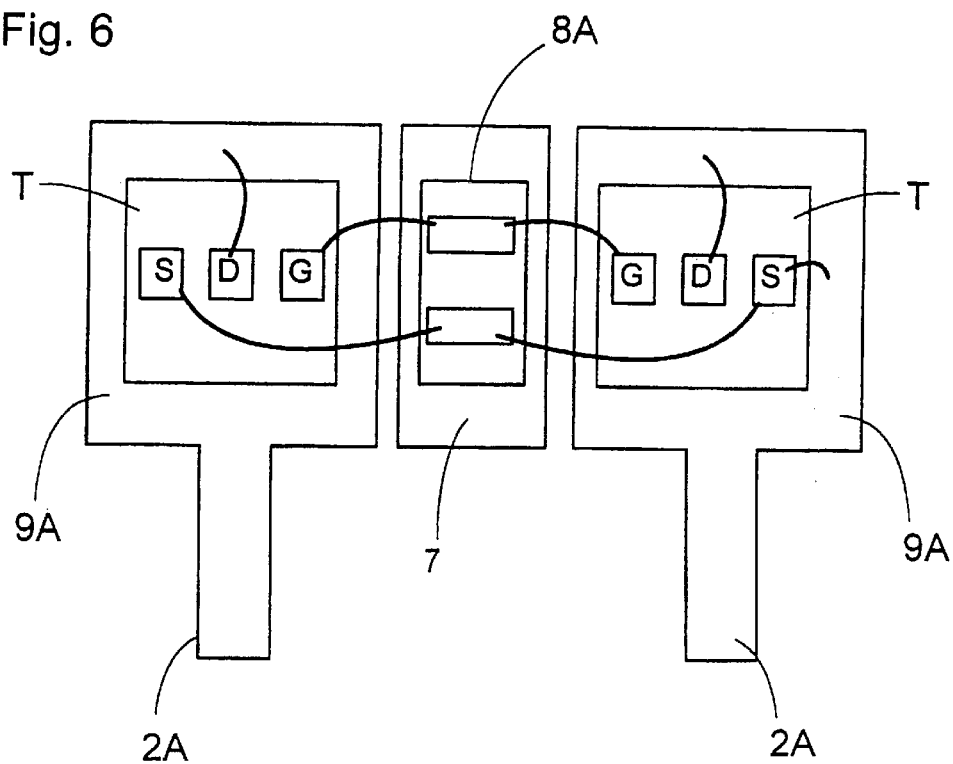
FIG. 6 is a schematic view illustrating a typical arrangement of electrical connections of the above relay in accordance with a second embodiment of the present invention.

FIG. 6 illustrates a solid-state relay in accordance with a second embodiment of the present invention in which each of two MOSFETs T is mounted on a separate supporting plate 9A of electrically conductive material and has its gate connected to a like control unit chip 8A mounted on a separate frame 7. Drain of each FET is electrically connected to each supporting plate 9A formed with an output terminals 2A as an integral part thereof.

Figure 7:
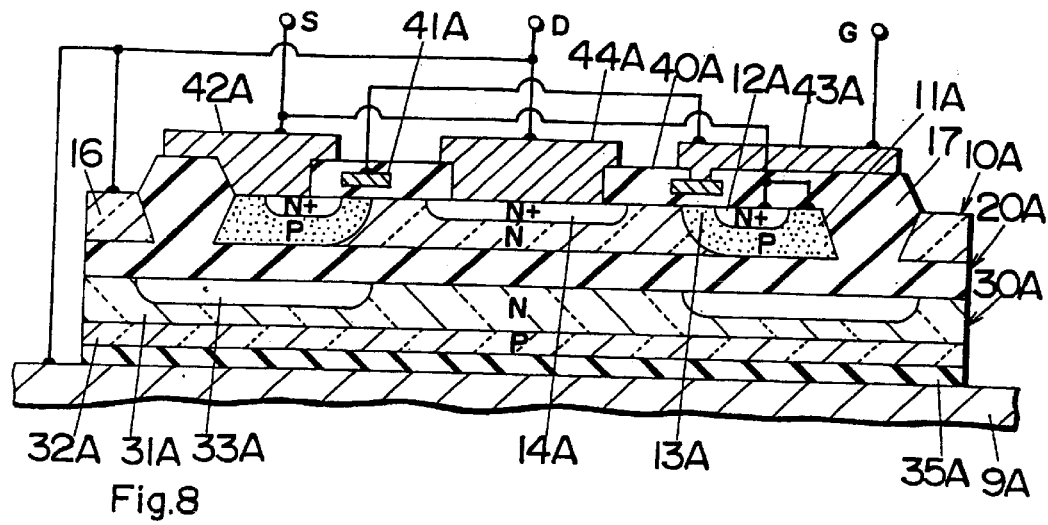
FIG. 7 is a partial vertical section of an SOI-LDMOSFET utilized in the relay of the second embodiment.
Figure 8:
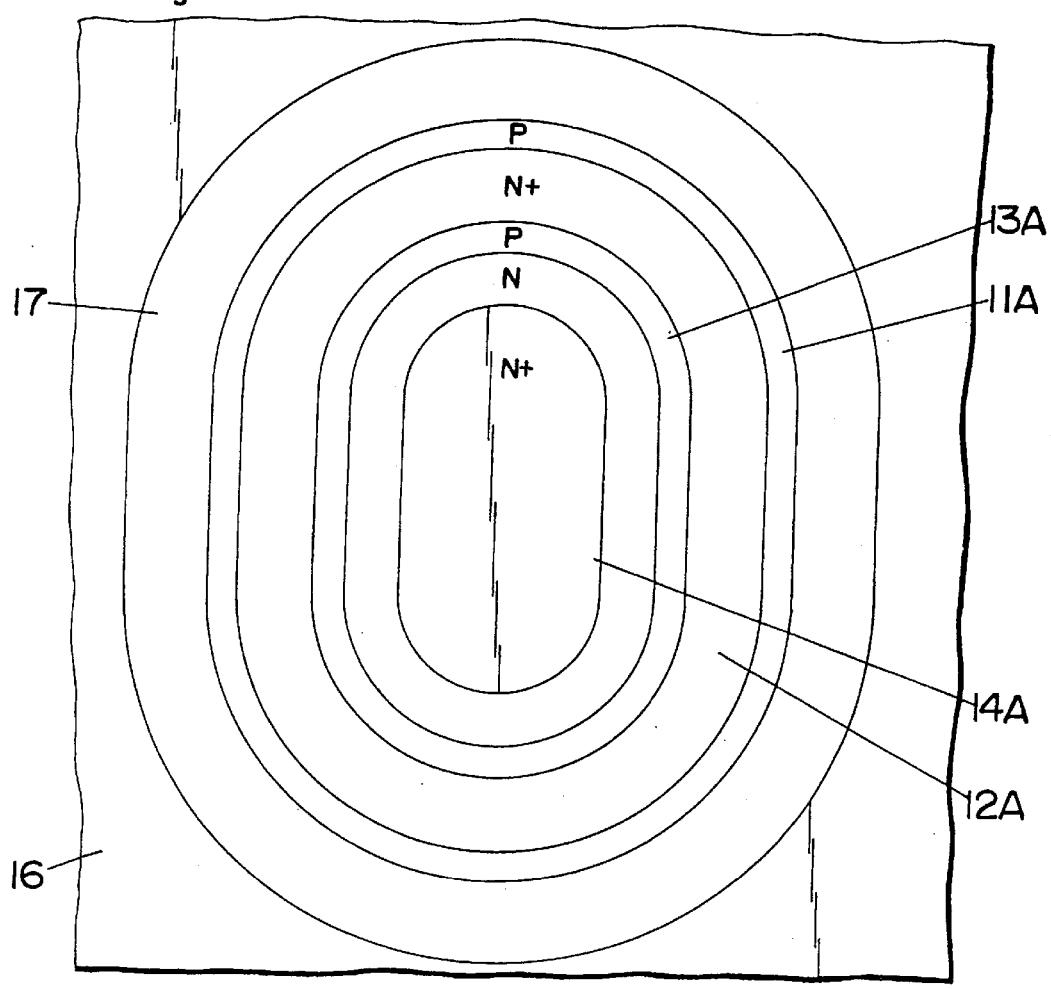
FIG. 8 illustrates a planar arrangement of well, source, drain regions of the SOI-MOSFET of FIG. 7.
Figure 9:
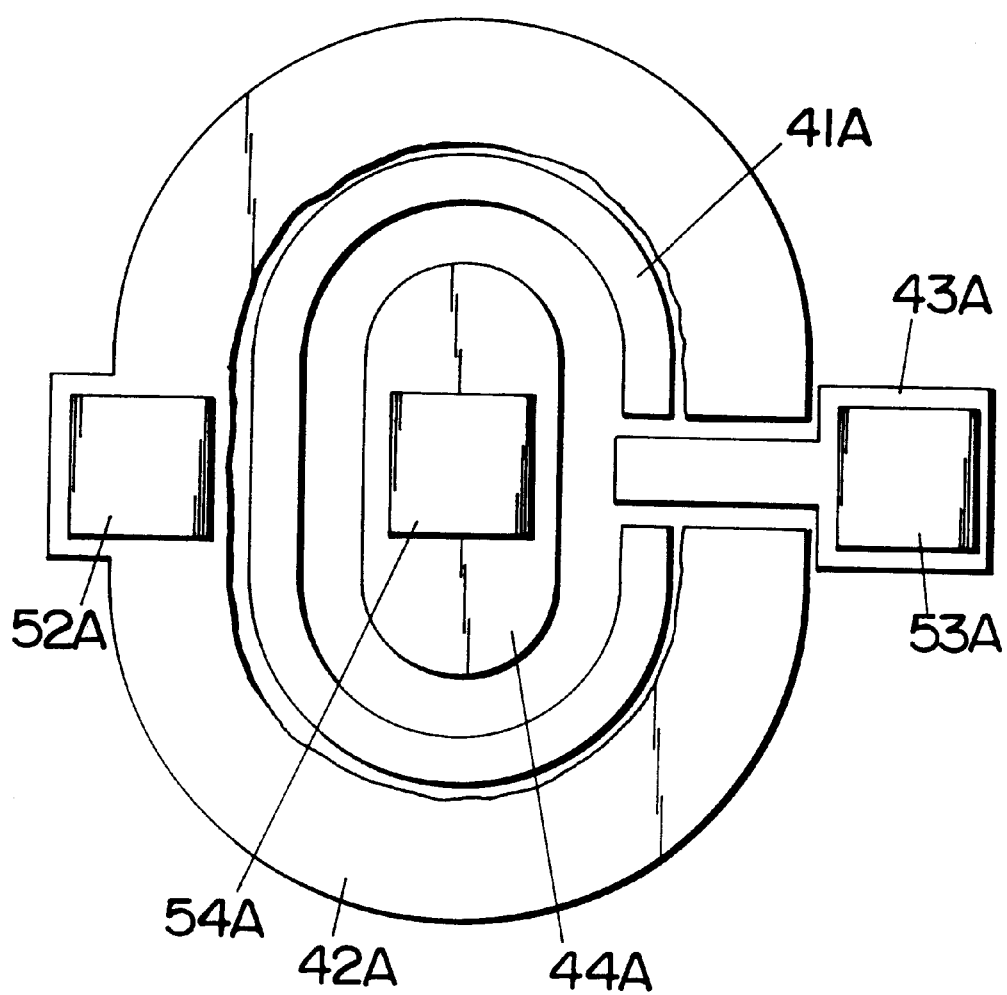
FIG. 9 illustrates a planar arrangement of gate, drain, and source electrodes and individual pads thereof for the above SOI-MOSFET.

As shown in FIGS. 7 and 8, FET is also of the SOI structure having an N-type silicon layer 10A, a buried oxide layer 20A, and a silicon substrate 30A. A P-type well region 11A of a closed loop configuration is diffused in the silicon layer 10A over the full depth thereof so as to leave therearound a peripheral isolated zone 16. A P-type source region 12A of the like closed loop configuration is diffused in the top surface of the well region 11A to define the source of FET as well as to define a channel 13A between the source region 12A and a confronting inner periphery of the well region 11A. An N-type drain region 14A is diffused centrally in the top surface of the silicon layer 10A within a confine of the well region 11A to define the drain of FET. Extending immediately around of the well region 11A is a dielectric separator ring 17 of silicon oxide formed by the LOCOS method to have its bottom reaching the buried oxide layer 20A. The separator ring 17 projects above the silicon layer 10A and merges into a field oxide layer 40A covering the top surface of the silicon layer 10A. The field oxide layer 40A includes a gate layer 41A of doped polysilicon extending in a closed loop over the channel 13A in a spaced relation therefrom to define the gate of FET. The gate layer 41A is electrically connected to a gate electrode 43A. Drain electrode 44A and source electrode 42A are formed to penetrate through the field oxide layer 40A for electrical connection respectively with the drain region 14A and a portion bridging the source region 12A and the well region 11A. The source electrode 42A and the gate electrode 43A extend laterally over the separator ring 17 to define individual pads 52A and 53A of square configuration for wiring connection to the associated circuit elements, as shown in FIG. 9. A like square pad 54A is formed centrally on the drain electrode 44A for wiring connection to the output terminal.

In this embodiment, the peripheral zone 16 is electrically connected to the supporting plate 9A together with the drain to be kept at the same electrical potential as the drain. With this arrangement, the buried oxide layer 20A corresponding to the peripheral zone 16 will not act to cause any capacitance which is added in parallel with the primary drain-source capacitance and also with the secondary capacitance formed in a vertical path from the bottom of the well region 11A and the supporting plate 9A. In this sense, the overall drain-source capacitance can be much reduced even with the presence of the peripheral zone 16. In addition, the separator ring 17 can prolong a horizontal path from the well region 11A to the peripheral zone 16, thereby reducing a capacitance therebetween and therefore serving to minimize the overall drain-source capacitance.

Also in this embodiment, the silicon substrate 30A is composed of an N-type upper stratum 31A and a P-type lower stratum 32A placed on the supporting plate 9A through a dielectric layer 35A. The upper stratum 31A includes a cavity 33A of annular configuration in a horizontal plane which is formed at an interface with the buried oxide layer 20A to extend horizontally in an opposed relation to a portion of the silicon layer 10A covering the well region 11A and the separator ring 17. The cavity 33A, the P-N interface between the stratums 31A and 32A, as well as the dielectric layer 35A function to reduce the overall drain-source capacitance in the same manner as explained with reference to the first embodiment.

Figure 10:
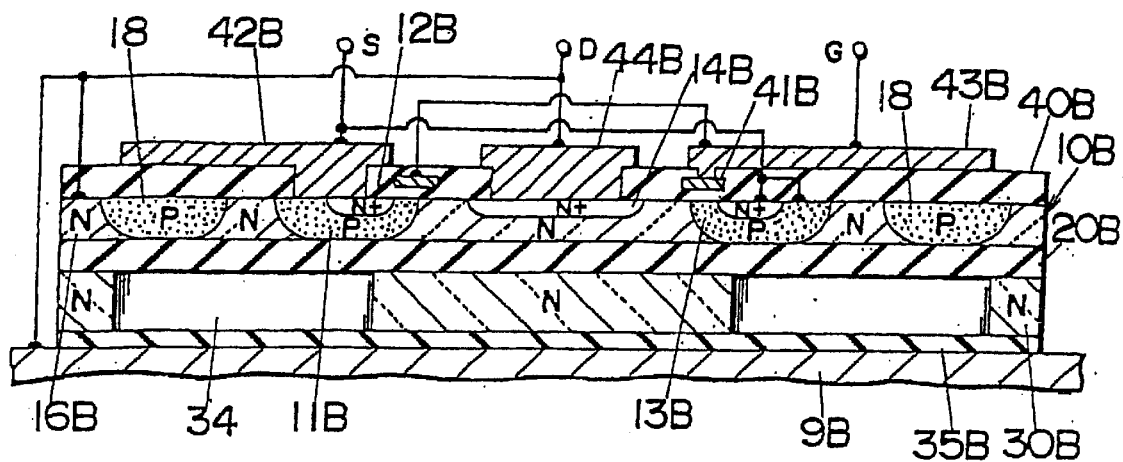
FIG. 10 is a partial vertical section of an SOI-LDMOSFET utilized in the relay in accordance with a third embodiment of the present invention.
Figure 11:
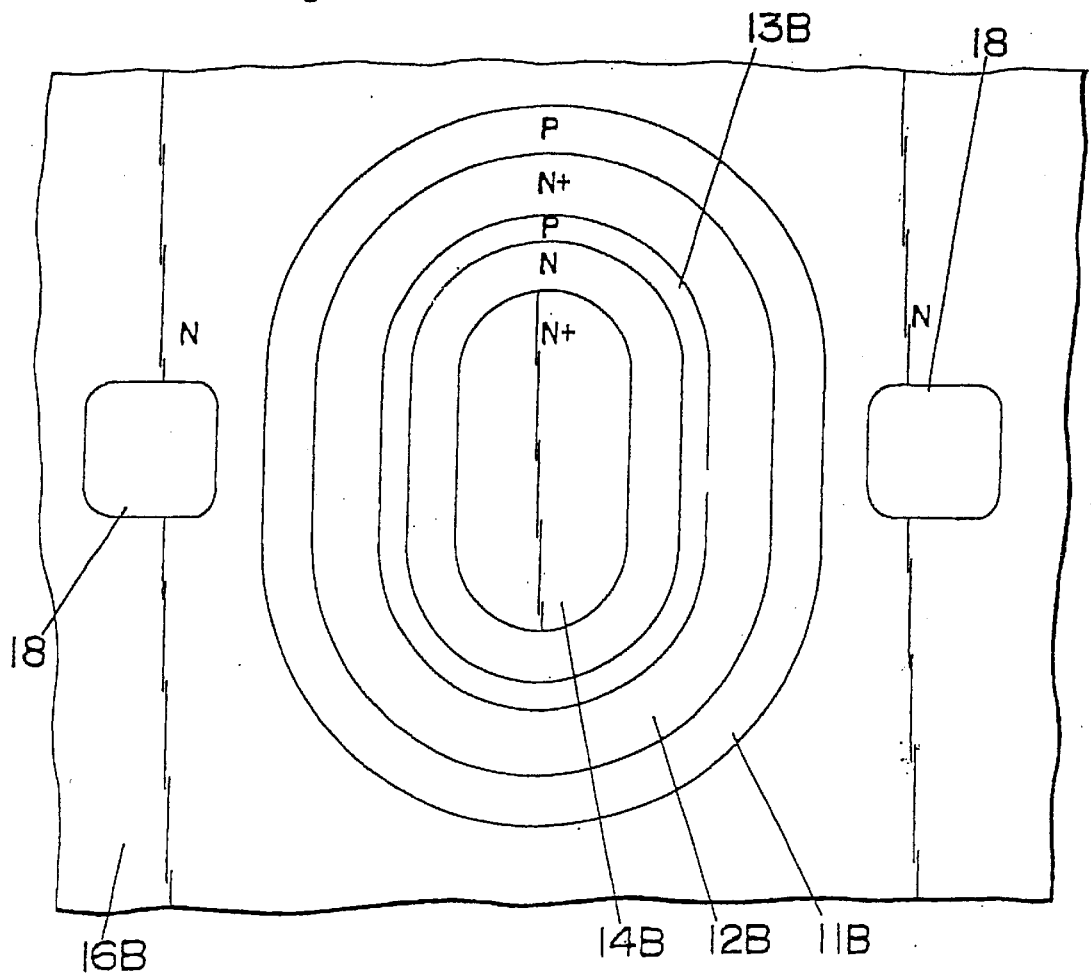
FIG. 11 illustrates a planar arrangement of well, source, drain regions of the SOI-MOSFET of FIG. 10.
Figure 12:
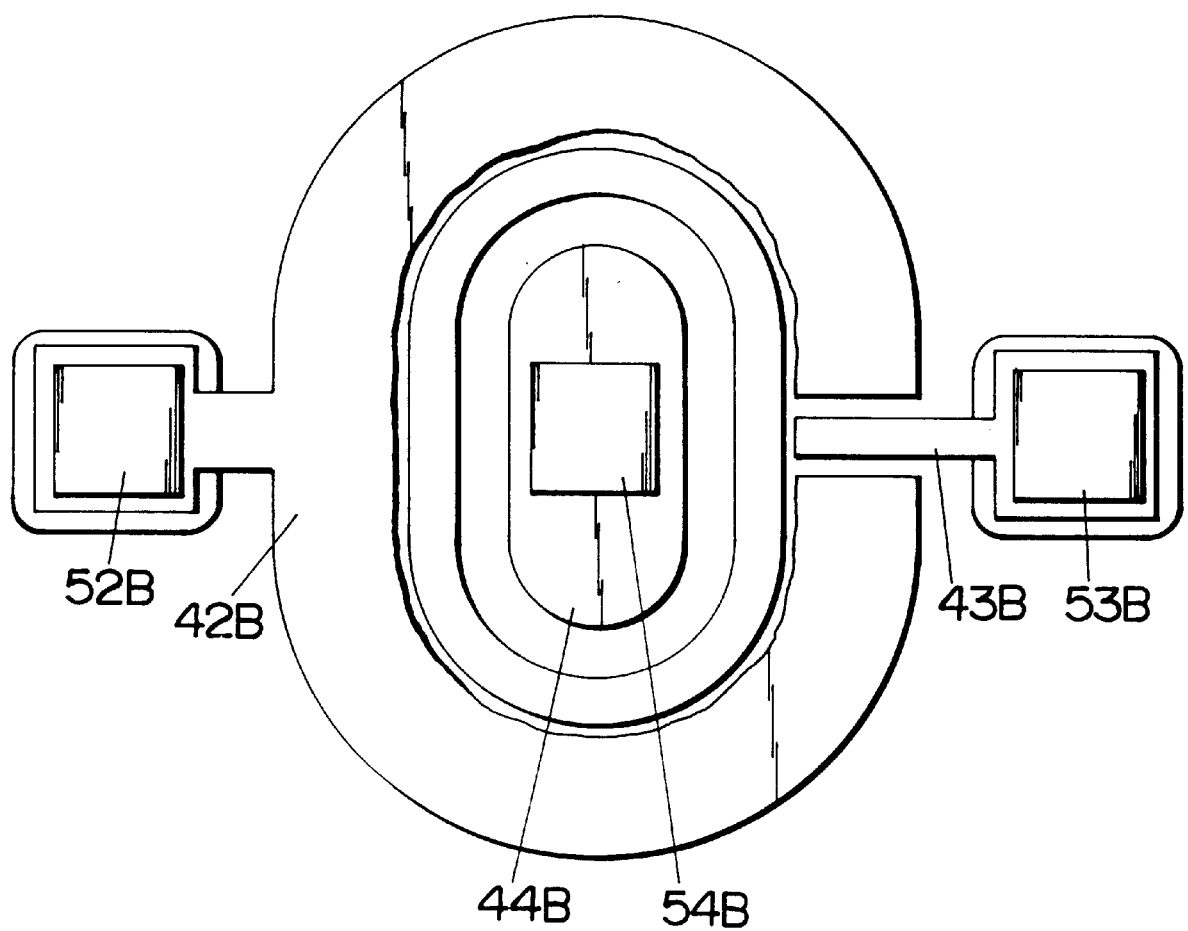
FIG. 12 illustrates a planar arrangement of gate, drain, and source electrodes and individual pads thereof for the above SOI-MOSFET.

FIGS. 10 to 12 illustrate another structure of SOI-LDMOSFET in accordance with a third embodiment of the present invention. FET of illustrated structure is adapted in use for the circuit configuration as shown in FIG. 6, and comprises a N-type silicon layer 10B, buried oxide layer 20B, and a silicon substrate 30B. A P-type well region 11B of a closed loop configuration is diffused in the silicon layer 10B over the full depth thereof so as to leave therearound a peripheral isolated zone 16B. A P-type source region 12B of the like closed loop is diffused in the top surface of the well region 11B to define a channel 13B between the source region 12B and a confronting inner periphery of the well region 11B. An N-type drain region 14B is diffused centrally in the top surface of the silicon layer 10B within a confine of the well region 11B. Locally diffused in the peripheral zone 16B are a pair of P-type land 18 which extend the full depth of the silicon layer 10B and arranged in a horizontal plate to be diametrically opposed to each other. The top surface of the silicon layer 10B is covered by a field oxide layer 40A provided with a gate layer 41B of doped polysilicon which extends over the channel 13B in a spaced relation therefrom and is electrically connected to a gate electrode 43B. Drain electrode 44B and source electrode 42B are formed to penetrate through the field oxide layer 40B for electrical connection respectively with the drain region 14B and a portion bridging the source region 12B and the well region 11B. The source electrode 42B and the gate electrode 43B extends laterally over the P-type lands 18 to define thereat individual pads 52B and 53B of square configuration for wiring connection to the associated circuit elements, as shown in FIG. 12. A like square pad 54B is centrally formed on the drain electrode 44B for wiring connection to the output terminal.

Also in this embodiment, the peripheral zone 16B is electrically connected to the supporting plate 9B together with the drain to be kept at the same electrical potential as the drain for reducing the overall drain-source capacitance for the same reason as explained in the second embodiment. With the provision of the lands 18 below the pads 52B and 53B for the source and gate electrodes 42B and 43B, each land adds its own capacitance resulting from the P-N junction with the peripheral zone 16B in series connection with a capacitance of the field oxide layer 40B caused by the pad, thereby reducing the capacitance developed between each pad to the peripheral zone 16B. Otherwise, the capacitance of the field oxide layer 40B would be alone connected in parallel with the inevitable drain-source and drain-gate capacitance to eventually increase the overall drain-source and gate-drain capacitance.

The silicon substrate 30B is of N-type formed with a recess 34 which is of an annular-shape in a horizontal plane and which extends the full depth of the silicon substrate 30B. The recess 34 covers a portion of the silicon layer 10B ranging laterally outwardly m the well region 11B and to the lands 18B, thus forming a capative element between the supporting plate 9B and the well regions 11B as well as the pads 52B and 53B. The resulting capacitances are connected in series with the inevitable drain-source and gate-drain capacitance including those caused by the provision of the pads, thereby reducing the overall drain-source and gate-drain capacitance. A like dielectric layer 35B is provided on the supporting plate 9B for the same purpose as discussed in the previous embodiment.

Instead of providing the lands 18 in the silicon layer 10B, it is equally possible to provide like lands of N-type within the well region 11B in a laterally isolated relation from the source region 12B for reducing the drain-source and gate-drain capacitance resulting from the provision of the pads for the source and gate electrodes.

It should be noted that, although the above illustrated embodiment discloses the configuration in which the drain region surrounded by the well region, it is equally possible to provide a configuration in which a like well region is formed centrally in the silicon layer and surrounded by a like drain region. In this modification, a peripheral zone around the drain region is electrically connected to a like supporting plate together with the source region. Also, a like separator ring may be formed around the drain region to electrically isolate the drain region from the peripheral zone.

Figure 13:
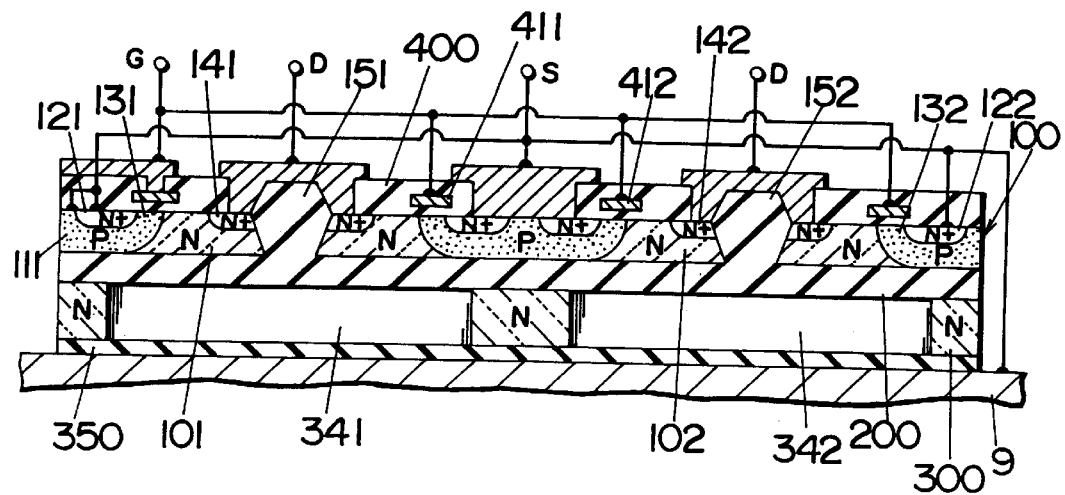
FIG. 13 is a partial vertical section of an SOI-LDMOSFET utilized in the relay in accordance with a fourth embodiment of the present invention.
Figure 14:
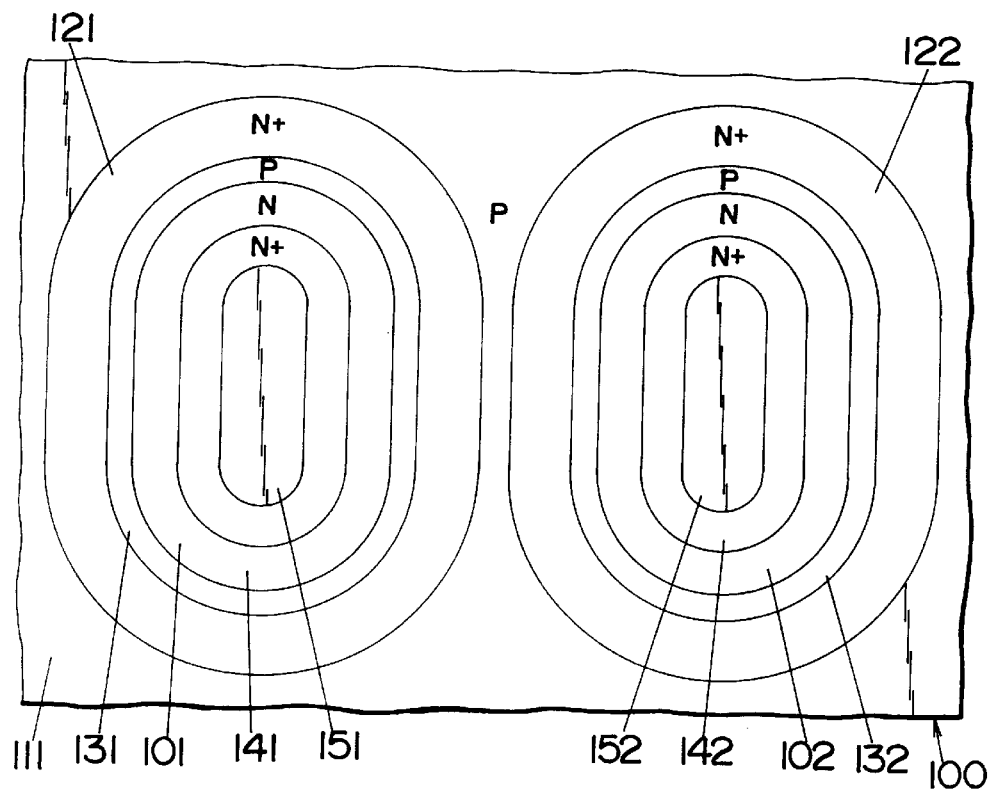
FIG. 14 illustrates a planar arrangement of well, source, drain regions of the SOI-MOSFET of FIG. 13.
Figure 15:
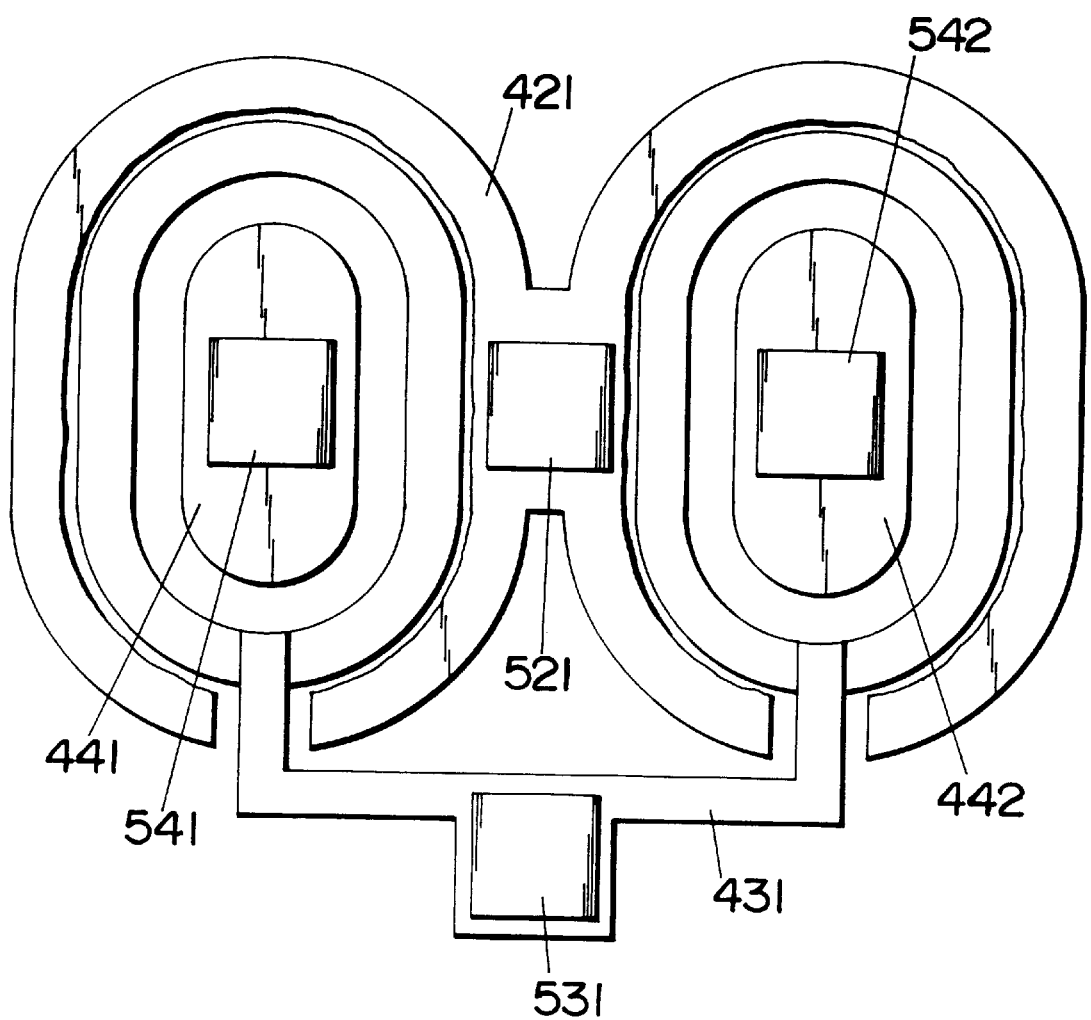
FIG. 15 illustrates a planar arrangement of gate, drain, and source electrodes and individual pads thereof for the above SOI-MOSFET.

Referring to FIGS. 13 to 15, there is shown a solid-state relay in accordance with a fourth embodiment of the present invention. The relay comprises a pair of LDMOSFETs integrated into a single device of the SOI structure composed of a N-type silicon layer 100, a buried oxide layer 200, and a silicon substrate 300. The single device is mounted on a supporting plate 9 of an electrically conductive material with a dielectric layer 350 interposed therebetween. A P-type well region 111 is diffused in the silicon layer 100 over the full depth thereof in such a manner as to form therein a laterally isolated pair of first and second active zones 101 and 102 of elliptical configuration. Formed respectively around the first and second active zones 101 and 102 are N-type first and second source regions 121 and 122 which are of closed loop configuration and diffused in the top surface of the well region 111 to define individual sources of FETs. The first and second source regions 121 and 122 also defines first and second channel 131 and 132 of closed loop within the well region between the individual source regions and the inwardly opposed peripheries of the first and second active zones 101 and 102. First and second N-type drain regions 141 and 142 are diffused in the top surface of silicon layer 100 respectively within the first and second active zone 101 and 102 in a laterally spaced relation to the well region 111 to define individual drains of FETs. First and second insulator studs 151 and 152 are formed by the LOCOS technique to project above the silicon layer 100 from the buried oxide layer 200 through the centers of the first and second drain regions 141 and 142, respectively.

The top surface of the silicon layer 100 is covered with a field oxide layer of $SiO_2$ 400 having a pair of first and second gate layers 411 and 412 of doped polysilicon, a gate electrode 431, a source electrode 421, and a drain electrode 441. The first and second gate layers 411 and 412 extend respectively over the first and second channels 131 and 132 in a spaced relation therefrom to define the individual gates of FET and are commonly connected to the gate electrode 431. The source electrode 421 penetrates through the field oxide layer 400 to reach a portion on the silicon layer 100 bridging over the first and source regions 121 and 122 through the well region 111 formed therebetween for interconnection of the sources of the two FETs. The first and second drain electrode 441 and 442 penetrate through the silicon layer 100 over the insulator studs 151 and 152 to contact with annuli of the first and second drain regions 141 and 142 around the insulator studs. As shown in FIG. 15, the gate electrode 431 is provided with a pad 531 for wiring connection with the associated circuit element, i.e., the control unit as shown in FIG. 1. The first and second drain electrodes 441 and 442 are provided respectively with pads 541 and 542 for wiring connection to output terminals of the relay. The source electrode 421 is provided with a single pad 521 for wiring connection to the supporting plate 9. The source is not necessarily connected to the supporting plate 9.

In the above structure, the well region 111 extends the full depth of the silicon layer 100 to form the two isolated active zone 101 and 102 on the buried oxide layer 200, enabling the formation of the two FETs in a single SOI structure, in addition to reducing the drain-source capacitance because of the reduced area of the well region 111 laterally confronting the drain region 141, 142 and also because of the lower specific capacitance of the buried oxide layer 200 than the silicon layer 100.

Despite that the buried oxide layer 200 has the low specific inductive capacitance, it will give a secondary capacitance particularly when the source is electrically connected to the supporting plate 9. The secondary capacitance is developed substantially in vertical paths from the drain regions 141 and 142 to the supporting plate 9 through the buried oxide layer 200 and is added in parallel capative connection with the primary drain-source capacitance developed substantially in the lateral path from the drain regions to the well region. In order to nevertheless cancel the secondary capacitance as much as possible, the N-type silicon substrate 300 is formed with a pair of laterally spaced recesses 341 and 342 and is placed on the supporting plate 9 through the dielectric layer 350.

Each of the recesses 341 and 342 extend the full depth of the silicon substrate 300 and has an elliptical configuration in a horizontal plane so as to cover a portion of the silicon layer 100 bounded by each of the first and second source regions 121, 122 and including the first and second drain regions 141, 142. The recesses 341 and 342 and the dielectric layer 350 give individual capacitances which are added in series capative connection with the drain-source capacitance of the buried oxide layer for reducing the total secondary drain-source capacitance, thereby minimizing the overall drain-source capacitance and therefore the output capacitance.

It should be noted in this connection that the supporting plate could be electrically isolated from the sources as well as from drain of each FET, while assuring a greatly reduced drain-source capacitance. In such modification, the silicon substrate would not require the recesses or cavity, and even the dielectric layer 350 may be eliminated.

Further, it is within the concept of the present invention to combine the specific features of the individual embodiments in order to reduce the secondary source-drain capacitance developed through the buried oxide layer. Those specific features include the provision of the insulator stud 15 through the drain region 14 (typically shown in FIG. 3), the intervention of the dielectric layer 35 between the supporting plate 9 and the silicon substrate 30 (typically shown in FIG. 3), the provision of cavity 33 or recess 34 (typically shown in FIGS. 3 and 10), and the provision of the stratums 31 and 32 of opposed type as the silicon substrate 30 forming therebetween the P-N junction (typically shown in FIG. 3).

LIST OF REFERENCE NUMERALS 1 input terminal
2 output terminal
3 control unit
4 light emitting diode
5 photovoltaic cell
6 driver
7 frame
8 chip (photodetector)
9 supporting plate
10 silicon layer
11 well region
12 source region
13 channel
14 drain region
15 insulating stud
16 peripheral zone
17 separator ring
18 land
20 buried oxide layer
30 silicon substrate
31 upper stratum
32 lower stratum
33 cavity
34 recess
35 dielectric layer
40 field oxide layer
41 gate layer
42 source electrode
43 gate electrode
44 drain electrode
52 pad for source electrode
53 pad for gate electrode
54 pad for drain electrode
60 dielectric layer
100 silicon layer
101 drift region
102 drift region
111 well region
121 source region
122 source region
131 channel
132 channel
141 drain region
142 drain region
151 insulator stud
152 insulator stud
200 buried oxide layer
300 silicon substrate
341 recess
342 recess
350 dielectric layer
400 field oxide layer
411 gate layer
412 gate layer
421 source electrode
431 gate electrode
432 gate electrode
441 drain electrode
442 drain electrode
521 pad for source electrode
531 pad for gate electrode
541 pad for drain electrode

What is claimed is:

1. A solid-state relay having a pair of output terminals for connection with a load to be controlled, said solid-state relay comprising:

a control means which gives an electrical energy upon receipt of an input signal;

a pair of LDMOSFETs, said LDMOSFETs having individual gates connected commonly to receive said electrical energy to be driven thereby, having individual source connected to each other, and having individual drains connected to said output terminals, respectively;

at least one supporting plate of electrically conductive material mounting thereon said LDMOSFETs;

each of said LDMOSFET comprising:
  a silicon layer of a first conductive type having top and bottom surfaces,
  a drain region of said the first conductive type diffused in the top surface of said silicon layer to define said drain of the LDMOSFET;
  a well region of a second conductive type diffused in said silicon layer in a laterally spaced relation from said drain region;
  a source region of the first conductive type diffused within said well region to define a channel extending between said source region and a confronting edge of said well region along the top surface of said silicon layer, said source region defining said source of the LDMOSFET;
  a drain electrode being placed on said drain region and electrically connected thereto;
  a gate electrode electrically connected to a gate layer of an electrically conductive material which is placed over said channel through a dielectric layer to define said gate; and
  a source electrode being placed over said source region and electrically connected thereto;
    wherein each of said LDMOSFET is of an SOI structure which comprises a silicon substrate, a buried oxide layer formed on said silicon substrate, and said silicon layer formed on said buried oxide layer, said silicon substrate being mounted on said supporting plate, and wherein said well region extends the full depth of said silicon layer to have a bottom abutted against said buried oxide layer,
    wherein said source region is configured to surround said drain region within a plane of said silicon layer, and
    wherein said silicon layer is formed with a peripheral zone located outwardly of said well region and isolated from said drain region by said well region, said peripheral zone and said drain region being electrically connected commonly to said supporting plate.

2. The solid-state relay as set forth in claim 1, wherein at least one separated land of the second conductive type is diffused in said silicon layer laterally outwardly of said well region in a spaced relation from said well region, at least one of said source electrode and said gate electrode extends over said at least one separator land in a spaced relation thereto from the corresponding one of said source and said channel to define thereat a wiring pad for connection with complementary circuit element.

3. The solid state relay as set forth in claim 1, wherein a land of the first conductive type is diffused within said well region to extend the full depth of said silicon layer in an electrically isolated relation from said source region, at least one of said source electrode and said gate electrode extends over said separator region in a spaced relation thereto from the corresponding one of said source and said channel to define thereat a wiring pad for connection with complementary circuit element.

4. A solid-state relay having a pair of output terminals for connection with a load to be controlled, said solid-state relay comprising:
  a control means which gives an electrical energy upon receipt of an input signal;
  a pair of LDMOSFETs, said LDMOSFETs having individual gates connected commonly to receive said electrical energy to be driven thereby, having individual source connected to each other, and having individual drains connected to said output terminals, respectively;
  at least one supporting plate of electrically conductive material mounting thereon said LDMOSFETs;
  each of said LDMOSFET comprising:
    a silicon layer of a first conductive type having top and bottom surfaces,
    a drain region of said the first conductive type diffused in the top surface of said silicon layer to define said drain of the LIDMOSFET;
    a well region of a second conductive type diffused in said silicon layer in a laterally spaced relation from said drain region;
    a source region of the first conductive type diffused within said well region to define a channel extending between said source region and a confronting edge of said well region along the top surface of said silicon layer, said source region defining said source of the LDMOSFET;
    a drain electrode being placed on said drain region and electrically connected thereto;
    a gate electrode electrically connected to a gate layer of an electrically conductive material which is placed over said channel through a dielectric layer to define said gate; and
    a source electrode being placed over said source region and electrically connected thereto;
      wherein each of said LDMOSFET is of an SOI structure which comprises a silicon substrate, a buried oxide layer formed on said silicon substrate, and said silicon layer formed on said buried oxide layer, said silicon substrate being mounted on said supporting plate, and wherein said well region extends the full depth of said silicon layer to have a bottom abutted against said buried oxide layer,
      wherein said source region is configured to surround said drain region within a plane of said silicon layer, and
      wherein a separator ring of a dielectric material surrounds closely said well region, said separator ring being formed in said silicon layer to isolate said well region from a peripheral zone of said silicon layer, said peripheral zone and said drain region being electrically connected commonly to said supporting plate.

5. The solid-state relay as set forth in claim 4, wherein at least one of said source electrode and said gate electrode extends laterally over said upper portion of said separator ring from above said well region.

6. A solid-state relay having a pair of output terminals for connection with a load to be controlled, said solid-state relay comprising:
  a control means which gives an electrical energy upon receipt of an input signal;
  a pair of LDMOSFETs, said LDMOSFETs having individual gates connected commonly to receive said electrical energy to be driven thereby, having individual source connected to each other, and having individual drains connected to said output terminals, respectively;
  at least one supporting plate of electrically conductive material mounting thereon said LDMOSFETs;
  each of said LDMOSFET comprising:
    a silicon layer of a first conductive type having top and bottom surfaces,
    a drain region of said the first conductive type diffused in the top surface of said silicon layer to define said drain of the LDMOSFET;

a well region of a second conductive type diffused in said silicon layer in a laterally spaced relation from said drain region;

a source region of the first conductive type diffused within said well region to define a channel extending between said source region and a confronting edge of said well region along the top surface of said silicon layer, said source region defining said source of the LDMOSFET;

a drain electrode being placed on said drain region and electrically connected thereto;

a gate electrode electrically connected to a gate layer of an electrically conductive material which is placed over said channel through a dielectric layer to define said gate; and a source electrode being placed over said source region and electrically connected thereto;

wherein each of said LDMOSFET is of an SOI structure which comprises a silicon substrate, a buried oxide layer formed on said silicon substrate, and said silicon layer formed on said buried oxide layer, said silicon substrate being mounted on said supporting plate, and wherein said well region extends the full depth of said silicon layer to have a bottom abutted against said buried oxide layer;

wherein said drain region is configured to surround said well region within a plane of said silicon layer, and wherein a dielectric separator ring surrounds closely said drain region, said separator ring being formed in said silicon layer to isolate said drain region from a peripheral zone of said silicon layer, said peripheral zone and said source region being electrically connected commonly to said supporting plate.

* * * * *